United States Patent
Joshi et al.

(10) Patent No.: US 9,320,171 B2
(45) Date of Patent: Apr. 19, 2016

(54) TWO-PHASE COOLING SYSTEMS, POWER ELECTRONICS MODULES, AND METHODS FOR EXTENDING MAXIMUM HEAT FLUX

(71) Applicant: Toyota Motor Engineering & Manufacturing North America, Inc., Erlanger, KY (US)

(72) Inventors: Shailesh N. Joshi, Ann Arbor, MI (US); Ercan M. Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 134 days.

(21) Appl. No.: 14/297,043

(22) Filed: Jun. 5, 2014

(65) Prior Publication Data

US 2015/0359133 A1 Dec. 10, 2015

(51) Int. Cl.
*H05K 7/20* (2006.01)

(52) U.S. Cl.
CPC .......... *H05K 7/2029* (2013.01); *H05K 7/2039* (2013.01); *H05K 7/20927* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,484,520 | B2 * | 11/2002 | Kawaguchi | B60H 1/3208 62/133 |
| 7,100,381 | B2 | 9/2006 | Hale et al. | |
| 7,185,699 | B2 * | 3/2007 | Zazovsky | C10M 161/00 166/244.1 |
| 7,277,283 | B2 | 10/2007 | Campbell et al. | |
| 7,334,630 | B2 | 2/2008 | Goodson et al. | |
| 8,046,113 | B2 | 10/2011 | Sharma et al. | |
| 2004/0206477 | A1 * | 10/2004 | Kenny | F04B 17/00 165/80.4 |
| 2011/0240281 | A1 | 10/2011 | Avery | |
| 2012/0267077 | A1 | 10/2012 | Dede | |

* cited by examiner

*Primary Examiner* — Gregory Thompson
(74) *Attorney, Agent, or Firm* — Dinsmore & Shohl LLP

(57) ABSTRACT

Two-phase cooling systems, power electronics modules, and methods for extending a maximum heat flux point of a two-phase cooling device are disclosed. In one embodiment, a method of operating a two-phase cooling device having an inlet, a chamber fluidly coupled to the inlet, and a heat transfer surface configured to receive heat flux from a heat generating device includes detecting at least one two-phase process parameter of the two-phase cooling device, and controlling a temperature of a coolant fluid at the inlet such that it is a first inlet temperature $T_{in1}$ when the at least one two-phase process parameter is less than a threshold. The method further includes controlling a temperature of the coolant fluid at the inlet such that it is a second inlet temperature $T_{in2}$, where $T_{in2}$ is less than $T_{in1}$.

20 Claims, 5 Drawing Sheets

TWO-PHASE COOLING SYSTEMS, POWER ELECTRONICS MODULES, AND METHODS FOR EXTENDING MAXIMUM HEAT FLUX

TECHNICAL FIELD

The present specification generally relates to two-phase cooling devices and systems and, more particularly, to two-phase cooling systems, power electronics modules, and methods for extending a maximum heat flux point of a two-phase cooling device.

BACKGROUND

Heat generating devices, such as power semiconductor devices, may be coupled to a heat spreader to remove heat and lower the maximum operating temperature of the heat generating device. In some applications, coolant fluid may be used to receive heat generated by the heat generating device by convective thermal transfer, and remove such heat from the heat generating device. For example, jet impingement may be used to cool a heat generating device by directing impingement jets of coolant fluid onto the heat generating device or onto a target surface that is thermally coupled to the heat generating device.

Two-phase cooling may also be utilized, where the heat generating device is cooled by the phase change of the coolant fluid from a liquid to a vapor. In two-phase cooling, the transfer of heat from the device surface to the coolant fluid takes place via bubble generation from boiling. The use of the boiling phenomena to dissipate high heat fluxes (W/cm$^2$) from surfaces is an effective mode of heat transfer. Every surface has a representative boiling curve that ranges from low heat flux (single phase) to maximum heat flux (i.e., safe heat flux) for a given fluid inlet temperature of a coolant fluid. Beyond the maximum heat flux value, all of the liquid coolant fluid transforms to vapor and may result in failure of the device that is attached to the two-phase cooling device.

Accordingly, a need exists for cooling apparatuses wherein the maximum heat flux for a given surface is increased.

SUMMARY

In one embodiment, a two-phase cooling system includes a two-phase cooling device, a sensor, and a temperature conditioning unit. The two-phase cooling device includes a body defining a chamber, an inlet fluidly coupled to the chamber, an outlet fluidly coupled to the chamber, and a heat transfer surface within the chamber, wherein the heat transfer surface is operable to receive heat flux from a heat generating device. The sensor is operable to generate a signal corresponding to at least one two-phase process parameter of the two-phase cooling device. The temperature conditioning unit includes a fluid input fluidly coupled to the outlet of the two-phase cooling device, and a fluid output fluidly coupled to the inlet of the two-phase cooling device. The temperature conditioning unit is operable to receive the signal and to control a temperature of a coolant fluid provided to the inlet of the two-phase cooling device such that it is a first inlet temperature $T_{in1}$ when the two-phase process parameter represented by the signal is below a threshold. The temperature conditioning unit is further operable to control the temperature of the coolant fluid provided to the inlet of the two-phase cooling device such that it is a second inlet temperature $T_{in2}$ when the two-phase process parameter represented by the signal is above the threshold, where $T_{in2}$ is less than $T_{in1}$.

In another embodiment, a method of operating a two-phase cooling device including an inlet, a chamber fluidly coupled to the inlet, and a heat transfer surface configured to receive heat flux from a heat generating device includes detecting at least one two-phase process parameter of the two-phase cooling device, and controlling a temperature of a coolant fluid at the inlet such that it is a first inlet temperature $T_{in1}$ when the at least one two-phase process parameter is less than a threshold. The method further includes controlling a temperature of the coolant fluid at the inlet such that it is a second inlet temperature $T_{in2}$, where $T_{in2}$ is less than $T_{in1}$.

In yet another embodiment, a power electronics module includes a semiconductor device, a two-phase cooling device, a sensor, and a controller. The two-phase cooling device includes a body defining a chamber, an inlet fluidly coupled to the chamber, an outlet fluidly coupled to the chamber, and a heat transfer plate. The heat transfer plate includes a heat receiving surface, wherein the semiconductor device is thermally coupled to the heat receiving surface, and a heat transfer surface within the chamber, wherein the heat transfer surface is operable to receive heat flux from a heat generating device. The sensor is operable to generate a signal corresponding to at least one two-phase process parameter of the two-phase cooling device. The controller is operable to receive the signal from the sensor and is programmed to, based on the signal, instruct a temperature control device to provide a coolant fluid to the inlet of the two-phase cooling device such that the temperature of the coolant fluid is a first inlet temperature $T_{in1}$ when the two-phase process parameter represented by the signal is below a threshold. The controller is further programmed to instruct the temperature control device to provide the coolant fluid to the inlet of the two-phase cooling device such that the temperature of the coolant fluid is a second inlet temperature $T_{in2}$ when the two-phase process parameter represented by the signal is above the threshold, where $T_{in2}$ is less than $T_{in1}$.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to two-phase cooling systems, power electronics modules and methods for operating a two-phase cooling device wherein a maximum heat flux point (i.e., the critical heat flux) is increased by lowering a temperature of an inlet fluid. More specifically, embodiments described herein extend the maximum heat flux for a given surface by dynamically changing the inlet temperature of the coolant fluid. As the two-phase cooling device operates at or close to a maximum heat flux point, the temperature of the coolant fluid at the inlet of the two-phase cooling device is lowered to raise the maximum heat flux point of the particular surface and coolant fluid (i.e., extend the maximum heat flux point on a boiling curve of the coolant fluid with respect to the surface).

Various embodiments of two-phase cooling systems, power electronics devices and methods for extending a maximum heat flux point are described in detail below.

Figure 1:
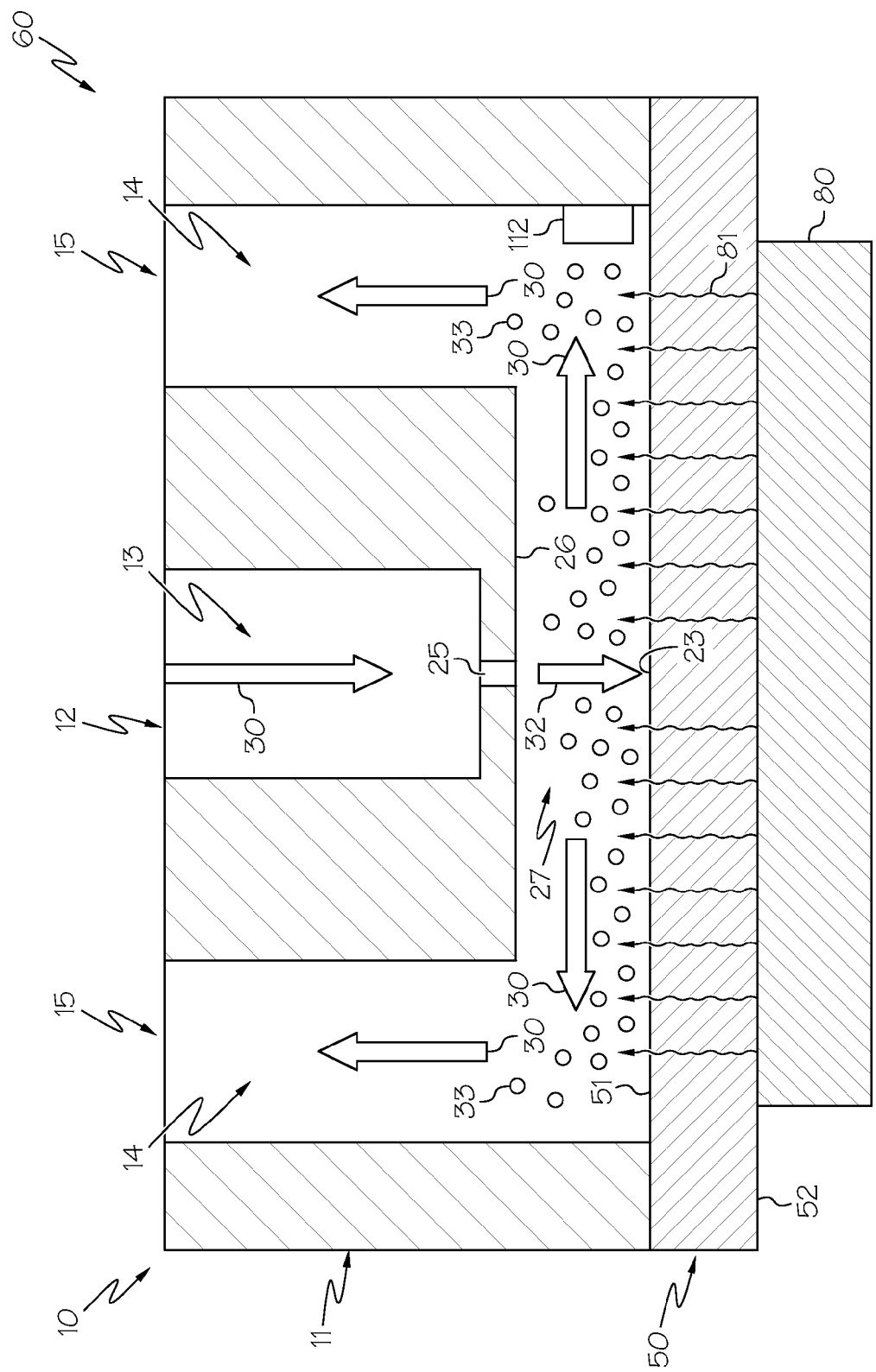
FIG. 1 schematically depicts a cross sectional view of a jet impingement, two-phase cooling device according to one or more embodiments described and illustrated herein.
Figure 2:
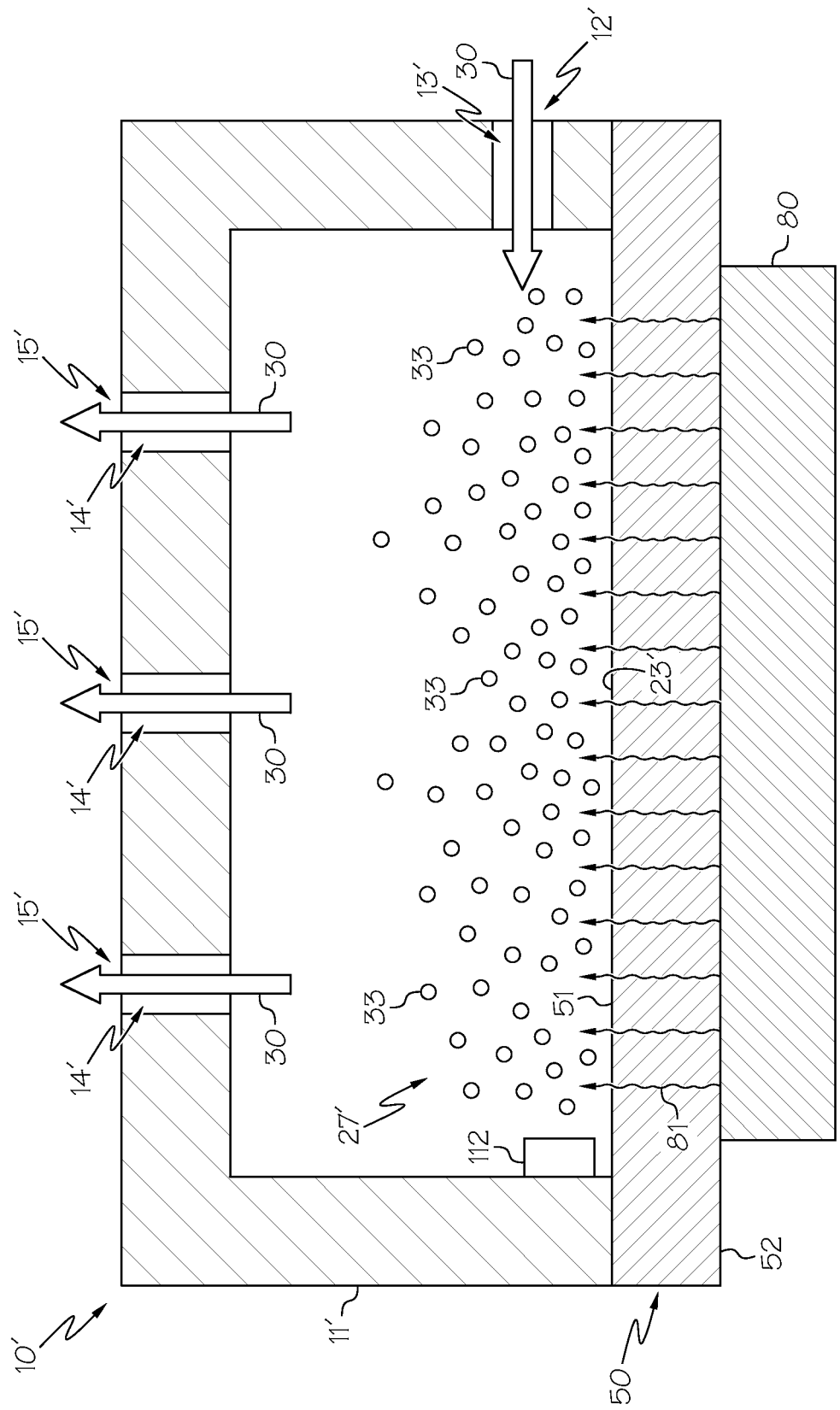
FIG. 2 schematically depicts a cross sectional view of a two-phase cooling apparatus according to one or more embodiments described and illustrated herein.

The two-phase cooling devices of the present disclosure may include jet impingement cooling devices, or pool boiling, two-phase cooling devices that do not incorporate jet impingement. FIG. 1 schematically depicts an example jet impingement, two-phase cooling device 10 in cross section, while FIG. 2 schematically depicts an example two-phase cooling device 10' that does not utilize jet impingement. The embodiments depicted by FIGS. 1 and 2 are for illustrative purposes only. It should be understood that the dynamic control of the temperature of inlet coolant fluid described herein may be incorporated into any two-phase cooling device.

Referring initially to FIG. 1, the example jet impingement, two-phase cooling device 10 generally comprises a body 11 having a fluid inlet 12 that is fluidly coupled to a fluid inlet channel 13, and several fluid outlet channels 14 that are fluidly coupled to one or more fluid outlets 15. In some embodiments, the fluid outlet channels 14 may converge to a single fluid outlet 15, and/or exit one or more sides of the two-phase cooling device 10 rather than the top as depicted in FIG. 1. The fluid inlet 12 and the fluid outlets 15 may be fluidly coupled to fluid lines (not shown) that are fluidly coupled to other components of a two-phase cooling system. The coolant fluid may be any appropriate liquid, such as deionized water or radiator fluid, for example. The fluid inlet 12 and the fluid outlets 15 may be configured as couplings, such as male or female fluid couplings, for connecting fluid lines to the fluid inlet 12 and the fluid outlets 15.

In the example embodiment, the fluid inlet channel 13 terminates at a jet orifice surface 26 having one or more jet orifices 25. The one or more jet orifices may take on any geometrical configuration, such as circular, elliptical, star-shaped, slot-shaped, and the like. Any number of jet orifices 25 may be provided. In some embodiments, multiple jet orifices 25 are arranged in an array.

Coolant fluid 30 flows through the fluid inlet channel 13 and the one or more jet orifices 25. The coolant fluid 30 exits the one or more jet orifices 25 as one or more impingement jets 32 that impinge a heat transfer surface 51 of a thermally conductive heat transfer plate 50 that is thermally coupled to a heat generating device, such as a semiconductor device 80. As shown in FIG. 1, the heat generating device (e.g., a semiconductor device 80) is thermally coupled to the heat transfer plate at a heat receiving surface 52. The heat transfer plate 50 may be integral with the body 11, or a separate component that is coupled to the body 11. A semiconductor device 80 coupled to a two-phase cooling device 10 defines a power electronics module 60.

It is noted that the heat transfer surface 51 may further include surface features, such as thermally conductive fins, posts, and the like (not shown), to further enable heat transfer from the heat generating device 80 to the coolant fluid 30. Additionally, in some embodiments, one or more regions of the heat receiving surface 52 may be porous (e.g., by a roughened surface and/or a porous coating or layer).

Semiconductor devices may include, but are not limited to, insulated gate bipolar transistors (IGBT), metal-oxide-semiconductor field effect transistors (MOSFET), power diodes, power bipolar transistors, and power thyristor devices. As an example and not a limitation, the semiconductor device 80 may be included in a power electronic module as a component in an inverter and/or converter circuit used to electrically power high load devices, such as electric motors in electrified vehicles (e.g., hybrid vehicles, plug in hybrid electric vehicles, plug in electric vehicles, and the like).

The one or more impingement jets 32 may be substantially normal with respect to the heat transfer plate 50 in embodiments, for example. After impinging the heat transfer surface 51, which may be configured as a plate of thermally conductive material such as copper or aluminum, for example, the coolant fluid 30 flows away from an impingement region 23 within a chamber 27 defined by the heat transfer surface 51 and the jet orifice surface 26. The coolant fluid 30 changes phase from a liquid to a vapor due to the high temperature heat generating device 80. The heat flux generated by the heat generating device 80 is schematically depicted by arrows 81. This phase change will cause vapor (illustrated as vapor bubbles 33) to form near the impingement region 23 and the heat generating device 80. The vapor then rises through the fluid outlet channels 14 and exits the fluid outlets 15.

Referring now to FIG. 2, an alternative two-phase cooling device 10' that does not utilize jet impingement is schematically depicted. The example two-phase cooling device 10' comprises a body 11' coupled to a heat transfer plate 50. The body 11' and the heat transfer plate 50 define a chamber 27'. The heat transfer plate 50 has a heat transfer surface 51 within the chamber, and a heat receiving surface 52 that is thermally coupled to a heat generating device, such as a semiconductor device 80. The heat transfer plate 50 may be integral with the body 11, or a separate component that is coupled to the body 11.

The body 11' includes one or more fluid inlets 12' and fluid inlet channels 13' for receiving coolant fluid. The one or more fluid inlets 12' may be configured as fluid couplings, as described above with respect to FIG. 1. The fluid inlet 12' and fluid inlet channel 13' may be positioned at any location within the body 11'. As shown in FIG. 2, the fluid inlet channel 13' is fluidly coupled to the chamber 27'. The fluid inlet 12' may be connected to one or more fluid lines that are fluidly coupled to a coolant fluid source (not shown). In this manner, coolant fluid 30 enters the chamber 27' through the fluid inlet 12' and the fluid inlet channel 13'.

The body 11' also includes several outlet channels 14' and fluid outlets 15'. The fluid outlets 15' may be configured as fluid couplings, as described above with respect to FIG. 1. Although FIG. 2 depicts three outlet channels 14' and fluid outlets 15', any number of outlet channels and fluid outlets may be provided in any configuration. In the illustrated embodiment, the outlet channels 14' and the fluid outlets 15' are disposed within an upper wall of the so that vapor bubbles 33 within the chamber 27' may naturally rise within the chamber 27' and exit the two-phase cooling device 10' through the outlet channels 14' and the fluid outlets 15'.

The coolant fluid 30 that enters into the chamber 27' through the fluid inlet 12' and the fluid inlet channel 13' pools on the heat transfer surface 51 where it boils and changes into a vapor due to the heat flux 81 generated by the semiconductor device 80 (or other heat generating device). The vapor then rises and exits the two-phase cooling device 10' through the outlet channels 14' and fluid outlets 15'. In this manner, heat created by the semiconductor device 80 is removed by two-phase heat transfer.

Figure 3:
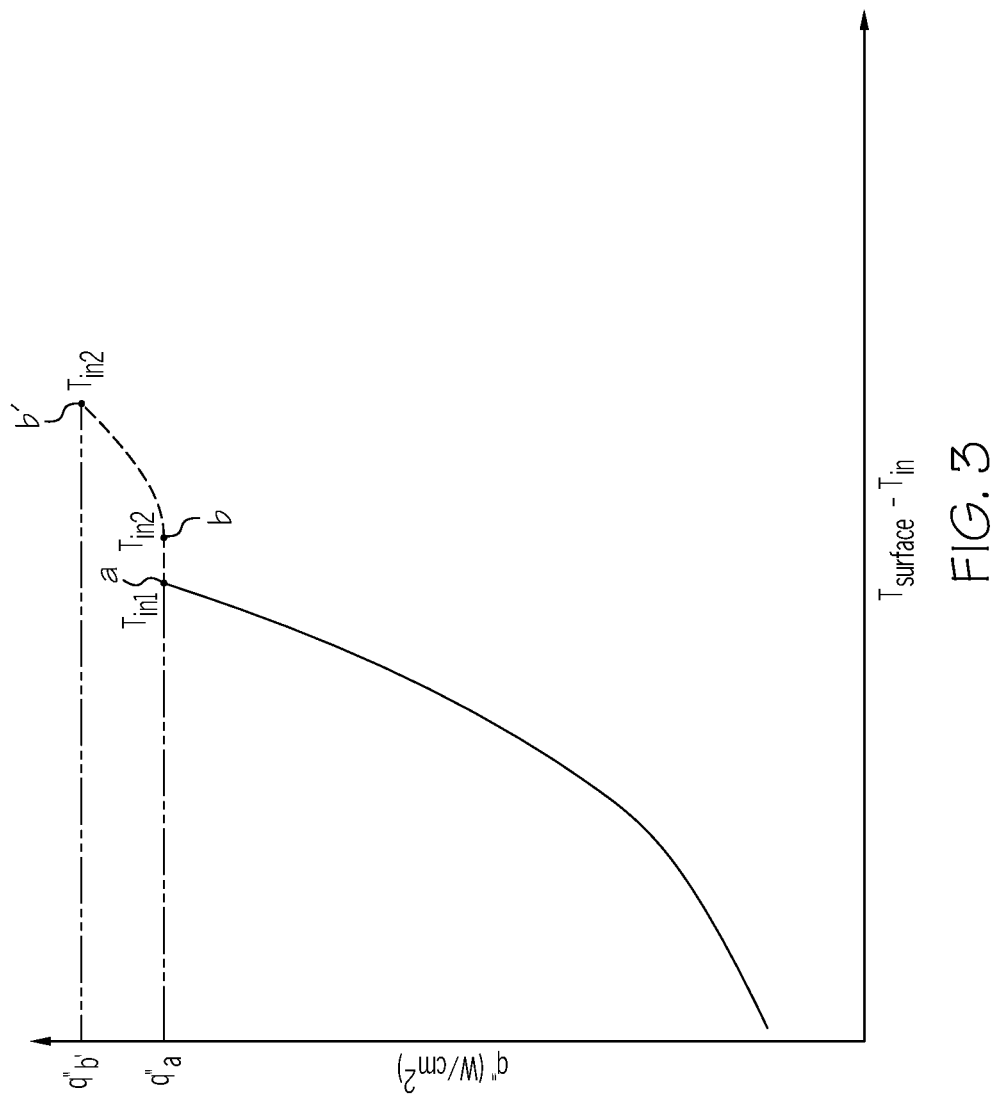
FIG. 3 graphically depicts a boiling curve for a surface wherein the coolant fluid is at a first inlet temperature and a second inlet temperature according to one or more embodiments described and illustrated herein.

Referring now to FIG. 3, the heat transfer surface 51 has a boiling curve for a particular coolant fluid. The horizontal axis of the graph depicted in FIG. 3 is the temperature difference represented by the maximum temperature of the coolant fluid at the heat transfer surface 51 ($T_{surface}$) minus the temperature of the coolant fluid at the fluid inlet 12 ($T_{in}$). The vertical axis is the heat flux q" (W/cm$^2$). The solid line of the boiling curve has a maximum heat flux point labeled "a" when the temperature of the coolant fluid at the inlet is equal to a first inlet temperature $T_{in1}$. When the two-phase cooling device operates at a temperature beyond the maximum heat flux point, the coolant fluid turns entirely to vapor near the heat transfer surface 51 and damage may occur to the semiconductor device 80.

Embodiments of the present disclosure increase the maximum heat flux point "a" to a higher maximum heat flux point "b'" on the boiling curve. To increase the maximum heat flux point from point "a" to point "b'," the coolant fluid inlet temperature is lowered from the first inlet temperature $T_{in1}$ to a second inlet temperature $T_{in2}$ when the operation of the two-phase cooling device is close to the maximum heat flux point "a." By lowering the inlet temperature, the temperature difference ($T_{surface}-T_{in}$) is increased, thereby resulting in point "b" in the dashed curve illustrated in FIG. 3. Because of the lower fluid inlet temperature, the bulk temperature of the coolant fluid is reduced, which allows the heat flux to be increased to a higher maximum heat flux point "b'." This new maximum heat flux value $q''_{b'}$ is greater than maximum heat flux value $q''_a$. As an example and not a limitation, lowering the inlet temperature of the coolant fluid close to the maximum heat flux point may provide for about a 30% increase in the maximum heat flux point for a smooth copper heat transfer surface. It is noted that the first inlet temperature $T_{in1}$ and the second inlet temperature $T_{in2}$ may not be static values in some embodiments, and may vary depending on operation of the two-phase cooling device.

Figure 4:
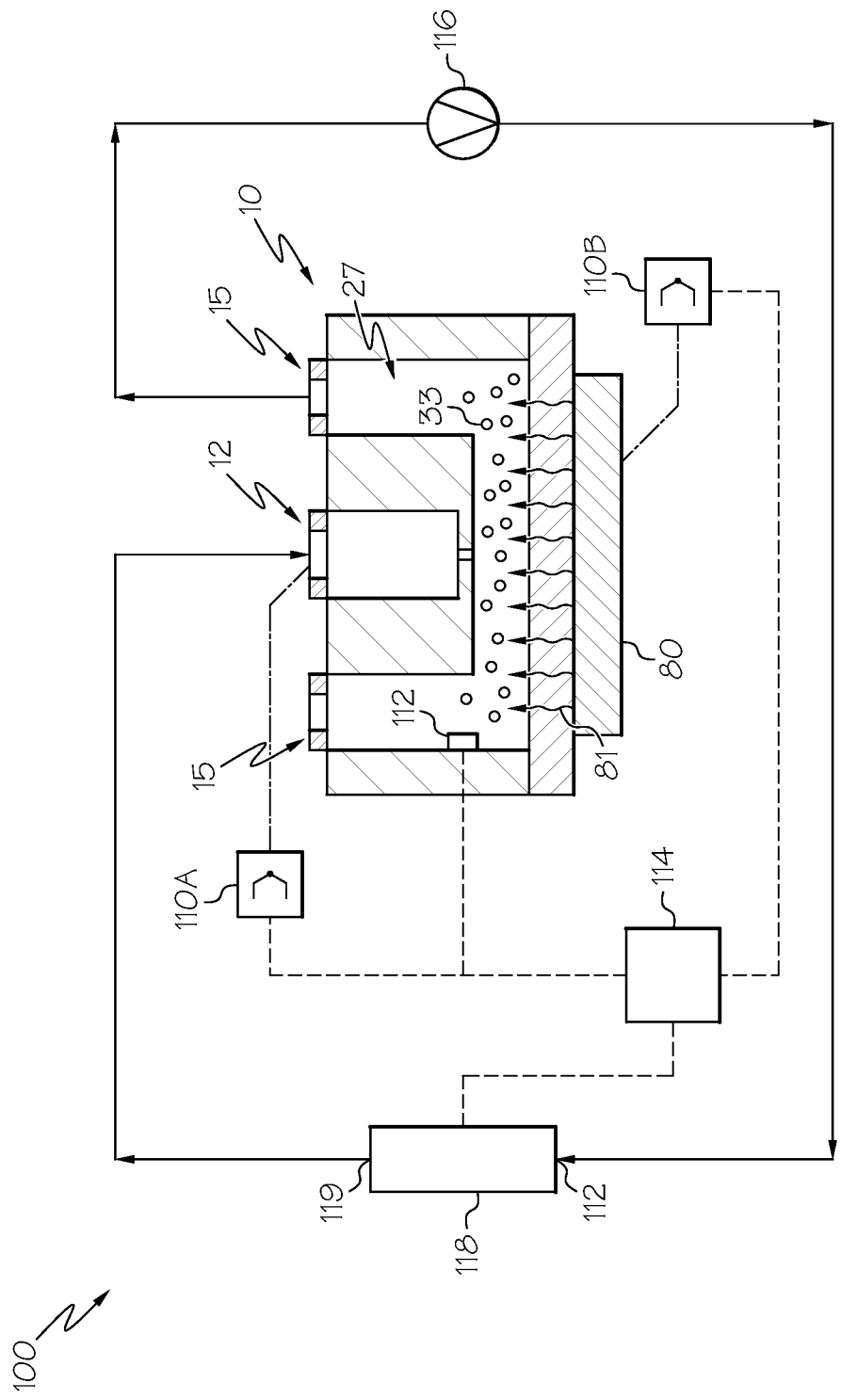
FIG. 4 schematically depicts a two-phase cooling system including a two-phase cooing device and a temperature conditioning unit according to one or more embodiments described and illustrated herein.

Referring now to FIG. 4, an example two-phase cooling system 100 incorporating a two-phase cooling device (e.g., a two-phase cooling device 10, 10' as depicted in FIG. 1 or 2, or any other two-phase cooling device) is schematically depicted. Arrows depict the coolant fluid flow within the two-phase cooling system 100. It should be understood that coolant fluid may exit one or more fluid outlets 15, although only one arrow representing coolant fluid exiting the two-phase cooling device 10 is shown in FIG. 4 for ease of illustration. In the illustrated embodiment, the two-phase cooling system 100 further includes a temperature conditioning unit 118, a pump device 116, and one or more sensors. The sensors may include one or more of an inlet temperature sensor 110A, a device temperature sensor 110B and a pressure sensor 112. Any number of any type of sensors may be utilized.

An output 119 of the temperature conditioning unit 118, which, as described in more detail below, is configured to control the temperature of the coolant fluid based on one or more sensor signals, is fluidly coupled to the fluid inlet 12 of the two-phase cooling device 10 such that coolant fluid flows from the temperature conditioning unit 118 into the two-phase cooling device 10. The fluid outlet of the two-phase cooling device 10 is fluidly coupled to the pump device 116 in the illustrated embodiment. The pump device 116, which may be configured as any device capable of returning the coolant fluid to the temperature conditioning unit 118, may cool the vapor exiting the two-phase cooling device 10 such that it changes back into a liquid. The pump device 116 is fluidly coupled to an input of the temperature conditioning unit 118 to return the liquid coolant fluid to the temperature conditioning unit 118. As an example and not a limitation, the pump device 116 may be one or more components of a condensing cycle (e.g., a condenser).

In some embodiments, no separate pump device 116 (or other device, such as a condenser) is provided. Rather, the vapor coolant fluid is changed back into a liquid within the temperature conditioning unit 118. Still further, although FIG. 4 depicts a closed-loop system, embodiments are not limited thereto. For example, the fluid outlet 15 may remove the vapor coolant fluid to atmosphere or some other location where it is not reused by the two-phase cooling system 100. It should be understood that any number of configurations are possible.

The one or more sensors are configured to provide one or more signals corresponding to one or more two-phase process parameters indicative of the two-phase cooling device 10 operating close to the maximum heat flux point. For example, the two-phase cooling system 100 may include the device temperature sensor 110B, which produces a temperature signal corresponding to an operating temperature of the heat generating device 80, and/or the pressure sensor 112, which produces a pressure signal corresponding to a pressure within the two-phase cooling device 10. The temperature of the heat generating device 80 and the pressure within the two-phase cooling device 10 are indicative of whether or not the two-phase cooling device 10 is operating at close to the maximum heat flux point. The two-phase cooling device 10 may include one or more of the device temperature sensor 110B, the pressure sensor 112, or any other sensor indicative of the two-phase cooling device 10 operating at close to the maximum heat flux point.

The two-phase cooling system 100 may or may not include the inlet temperature sensor 110A, which may be provided to provide feedback regarding the temperature of the coolant fluid at the fluid inlet 12.

In the illustrated embodiment, each of the sensors (e.g., inlet temperature sensor 110A, device temperature sensor 110B and pressure sensor 112) may be communicatively coupled to a controller 114. As described in more detail below, in alternative embodiments, the controller 114 is an integral component with the temperature conditioning unit 118 such that a separate controller 114 is not provided. The controller 114 is configured to receive one or more signals from the one or more sensors (e.g., the inlet temperature sensor 110A, the device temperature sensor 110B and/or the pressure sensor 112) and produce one or more output signals that are provided to the temperature conditioning unit 118. The output signal, which may be an analog signal or a digital signal, for example, may correspond with the heat flux point of the two-phase cooling device 10.

The controller 114 may be configured as any processing or computing device capable of receiving one or more signals and producing one or more output signals to control the temperature conditioning unit 118. Example processing or computing devices for the controller 114 include, but are not limited to, programmable logic controllers, analog to digital converter devices, digital to analog converter devices, general purpose microcontrollers, application specific integrated circuits, discrete electronic components, and general purpose computing devices. The functionality of the controller 114 may be provided by any combination of software, hardware and firmware. In some embodiments, the controller 114 may include a non-transitory computer-readable medium storing instructions to receive the one or more signals and produce the one or more output signals. As stated above, in some embodiments, the functionality of the controller 114 is performed by the temperature conditioning unit 118 and not a by a separate controller.

As stated above, the temperature conditioning unit 118 is operable to control a temperature of the coolant fluid provided to the fluid inlet 12 of the two-phase cooling device based on the output signal provided by the controller 114. In alternative embodiments wherein there is no external controller 114, the temperature conditioning unit 118 may directly receive the one or more signals from the one or more sensors. The temperature conditioning unit 118 may be configured as any device capable of regulating the temperature of the coolant fluid at the fluid inlet 12. For example, the temperature conditioning unit 118 may be capable of heating coolant fluid, cooling coolant fluid and/or heating and cooling coolant fluid disposed within the temperature conditioning unit 118 so that the temperature of the coolant fluid at the fluid inlet 12 is at the desired temperature (e.g., the first inlet temperature $T_{in1}$ or a second inlet temperature $T_{in2}$). As non-limiting examples, the temperature conditioning unit 118 may include one or more of a heating element, a radiator, a condenser, and a thermoelectric cooling device. Accordingly, the temperature conditioning unit 118 may be any device capable of dynamically switching between the first inlet temperature $T_{in1}$ and the second inlet temperature $T_{in2}$ based on feedback signals regarding one or more sensors and/or one or more control signals from the controller 114. More specifically, the temperature conditioning unit 118 may switch from the first inlet temperature $T_{in1}$ to the second inlet temperature $T_{in2}$ when the two-phase process parameter(s) (e.g., temperature or pressure) is above a threshold that is indicative of the two-phase cooling device 10 operating close to the maximum heat flux point.

By lowering the inlet temperature when the two-phase cooling device 10 operates near the maximum heat flux point, the maximum heat flux point, and therefore the cooling capacity, is increased.

For example, a temperature of the heat generating device 80 that is above a temperature threshold, as indicated by the signal provided by the device temperature sensor 110B, may suggest that the two-phase cooling device 10 is operating close to or at the maximum heat flux point. The controller 114 may produce an output signal based on the signal provided by the device temperature sensor 110B accordingly. As another example, a pressure within the two-phase cooling device that is above a pressure threshold, as indicated by the signal provided by the pressure sensor 112, may also suggest that the two-phase cooling device 10 is operating close to or at the maximum heat flux point. The controller 114 may produce an output signal based on the signal provided by the pressure sensor 112 accordingly. In some embodiments, the output signal generated by the controller 114 may be based on signals from multiple sensors (e.g., the device temperature sensor 110B and the pressure sensor 112). For example, the controller 114 may be programmed to receive a temperature signal and a pressure signal, and apply a calculation to both the device temperature signal and the pressure signal to generate one or more output signals.

Figure 5:
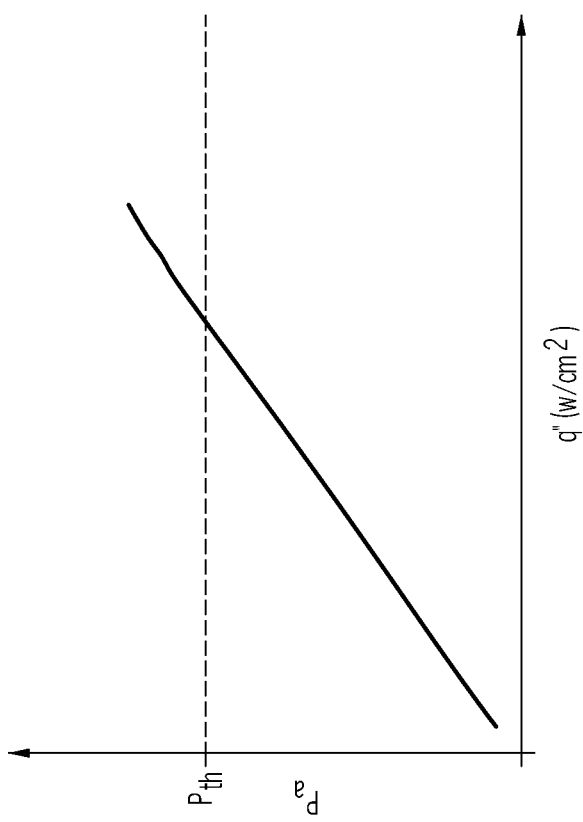
FIG. 5 graphically depicts the relationship between heat flux created by the heat generating device and pressure within the two-phase cooling device.

Referring now to FIG. 5, a graph depicting the relationship between heat flux generated by the heat generating device 80 (x-axis) and the pressure within the chamber 27 of the two-phase cooling device (y-axis) is provided. As shown in FIG. 5, an increase in heat flux causes an increase in pressure within the chamber 27. The pressure within the chamber 27 is monitored by one or more pressure sensors 112, which provides a pressure signal to the controller or directly to the temperature conditioning unit 118. When the pressure sensor 112 detects a pressure within the chamber 27 that is above a pressure threshold $P_{th}$, the temperature conditioning unit 118 lowers the inlet temperature of the cooling fluid at the two-phase cooling device 10.

It should now be understood that embodiments described herein are directed to two-phase cooling systems, power electronics modules, and methods for extending a maximum heat flux point of a two-phase cooling device. Embodiments described herein lower a fluid inlet temperature when the two-phase cooling device operates close to a maximum heat flux point, thereby increasing the maximum heat flux point and the cooling capacity of the two-phase cooling device.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A two-phase cooling system comprising:
 a two-phase cooling device comprising:
  a body defining a chamber;
  an inlet fluidly coupled to the chamber;
  an outlet fluidly coupled to the chamber; and
  a heat transfer surface within the chamber, wherein the heat transfer surface is operable to receive heat flux from a heat generating device;
 a sensor operable to generate a signal corresponding to at least one two-phase process parameter of the two-phase cooling device; and
 a temperature conditioning unit comprising a fluid input fluidly coupled to the outlet of the two-phase cooling device, and a fluid output fluidly coupled to the inlet of the two-phase cooling device, wherein:
  the temperature conditioning unit is operable to receive the signal; and
  the temperature conditioning unit is operable to control a temperature of a coolant fluid provided to the inlet of the two-phase cooling device such that it is a first inlet temperature $T_{in1}$ when the two-phase process parameter represented by the signal is below a threshold; and
  the temperature conditioning unit is operable to control the temperature of the coolant fluid provided to the inlet of the two-phase cooling device such that it is a second inlet temperature $T_{in2}$ when the two-phase process parameter represented by the signal is above the threshold, where $T_{in2}$ is less than $T_{in1}$.

2. The two-phase cooling system of claim 1, wherein the temperature conditioning unit dynamically changes the temperature of the coolant fluid at the inlet of the two-phase cooling device.

3. The two-phase cooling system of claim 1, wherein the sensor comprises at least one of a pressure sensor corresponding to a pressure within the chamber, and a temperature sensor providing a temperature of the heat transfer surface.

4. The two-phase cooling system of claim 1, wherein the threshold corresponds to a substantially maximum heat flux point of the coolant fluid when the temperature of the coolant fluid at the inlet is the first inlet temperature $T_{in1}$.

5. The two-phase cooling system of claim 4, wherein the threshold is at least one of a pressure threshold and a temperature threshold.

6. The two-phase cooling system of claim 1, wherein changing the temperature of the coolant fluid provided to the inlet of the two-phase cooling device to the second inlet temperature $T_{in2}$ from the first inlet temperature $T_{in1}$ raises a maximum heat flux point of the coolant fluid within the chamber.

7. The two-phase cooling system of claim 1, further comprising a pump device fluidly coupled to the outlet of the two-phase cooling device and the inlet of the temperature conditioning unit.

8. The two-phase cooling system of claim 1, wherein at least a portion of the heat transfer surface is porous.

9. The two-phase cooling system of claim 1, wherein:
the two-phase cooling device further comprises a chamber fluidly coupled to the inlet, and a jet orifice surface positioned at an end of the chamber that is distal from the inlet; and
the jet orifice surface comprises one or jet orifices.

10. A method of operating a two-phase cooling device comprising an inlet, a chamber fluidly coupled to the inlet, and a heat transfer surface configured to receive heat flux from a heat generating device, the method comprising:
detecting at least one two-phase process parameter of the two-phase cooling device;
controlling a temperature of a coolant fluid at the inlet such that it is a first inlet temperature $T_{in1}$ when the at least one two-phase process parameter is less than a threshold; and
controlling a temperature of the coolant fluid at the inlet such that it is a second inlet temperature $T_{in2}$, where $T_{in2}$ is less than $T_{in1}$.

11. The method of claim 10, wherein the at least one two-phase process parameter comprises at least one of a pressure within the chamber and a temperature of the heat transfer surface.

12. The method of claim 10, wherein the threshold corresponds to a substantially maximum heat flux point of the coolant fluid when the temperature of the coolant fluid at the inlet is the first inlet temperature $T_{in1}$.

13. The method of claim 12, wherein the threshold is at least one of a pressure threshold and a temperature threshold.

14. The method of claim 12, wherein changing the temperature of the coolant fluid provided to the inlet of the two-phase cooling device to the second inlet temperature $T_{in2}$ from the first inlet temperature $T_{in1}$ raises a maximum heat flux point of the coolant fluid within the chamber.

15. A power electronics module comprising:
a semiconductor device;
a two-phase cooling device comprising:
    a body defining a chamber;
    an inlet fluidly coupled to the chamber;
    an outlet fluidly coupled to the chamber; and
    a heat transfer plate comprising:
        a heat receiving surface, wherein the semiconductor device is thermally coupled to the heat receiving surface; and
        a heat transfer surface within the chamber, wherein the heat transfer surface is operable to receive heat flux from a heat generating device;
a sensor operable to generate a signal corresponding to at least one two-phase process parameter of the two-phase cooling device; and
a controller operable to receive the signal from the sensor, wherein the controller is programmed to:
    based on the signal, instruct a temperature control device to:
        provide a coolant fluid to the inlet of the two-phase cooling device such that the temperature of the coolant fluid is a first inlet temperature $T_{in1}$ when the two-phase process parameter represented by the signal is below a threshold; and
        provide the coolant fluid to the inlet of the two-phase cooling device such that the temperature of the coolant fluid is a second inlet temperature $T_{in2}$ when the two-phase process parameter represented by the signal is above the threshold, where $T_{in2}$ is less than $T_{in1}$.

16. The power electronics module of claim 15, wherein the sensor comprises at least one of a pressure sensor corresponding to a pressure within the chamber, and a temperature sensor providing a temperature of the heat transfer surface.

17. The power electronics module of claim 15, wherein the threshold corresponds to a substantially maximum heat flux point of the coolant fluid when the temperature of the coolant fluid at the inlet is the first inlet temperature $T_{in1}$.

18. The power electronics module of claim 17, wherein the threshold is at least one of a pressure threshold and a temperature threshold.

19. The power electronics module of claim 15, wherein changing the temperature of the coolant fluid provided to the inlet of the two-phase cooling device to the second inlet temperature $T_{in2}$ from the first inlet temperature $T_{in1}$ raises a maximum heat flux point of the coolant fluid within the chamber.

20. The power electronics module of claim 15, wherein at least a portion of the heat transfer surface is porous.

* * * * *